United States Patent [19]

Schweitzer, Jr.

[11] Patent Number: 5,420,502

[45] Date of Patent: May 30, 1995

[54] FAULT INDICATOR WITH OPTICALLY-ISOLATED REMOTE READOUT CIRCUIT

[76] Inventor: Edmund O. Schweitzer, Jr., 2433 Center St., Northbrook, Ill. 60062

[21] Appl. No.: 994,558

[22] Filed: Dec. 21, 1992

[51] Int. Cl.6 .............................................. G01R 1/04
[52] U.S. Cl. ...................................... 324/96; 324/133
[58] Field of Search ....................... 324/133, 96, 107; 310/303

[56] References Cited

U.S. PATENT DOCUMENTS 5,012,182  4/1993  Fujiki et al. ............................ 324/96
5,237,233  8/1993  Conley .................................. 310/303

Primary Examiner—Kenneth A. Wieder
Assistant Examiner—Barry C. Bowser
Attorney, Agent, or Firm—Lockwood, Alex, Fitzgibbon & Cummings

[57] ABSTRACT

A fault indicator for indicating at local and remote locations the occurrence of a fault current in a conductor of an AC power distribution system utilizes a liquid crystal display having independent "F" and "N" optical display and shutter elements. Upon occurrence of a fault current a reed switch closes and a portion of the charge on a first capacitor is transferred to a second capacitor, which is connected to the "F" actuator electrodes of the liquid crystal display to cause an "F" to be displayed and an associated optical shutter to open. The "N" actuator electrodes are capacitively coupled to the monitored conductor and system ground to cause an "N" to be displayed and an associated optical shutter to open to indicate that voltage is present on the conductor. First and second light sources are caused to project through respective ones of the optical shutters onto respective first and second photodetectors. A first control circuit responsive to the output of the first photodetector provides a first output signal indicative of the occurrence of a fault. A second control circuit responsive to the second photodectector provides a second output signal indicative of the presence of voltage on the conductor.

5 Claims, 6 Drawing Sheets

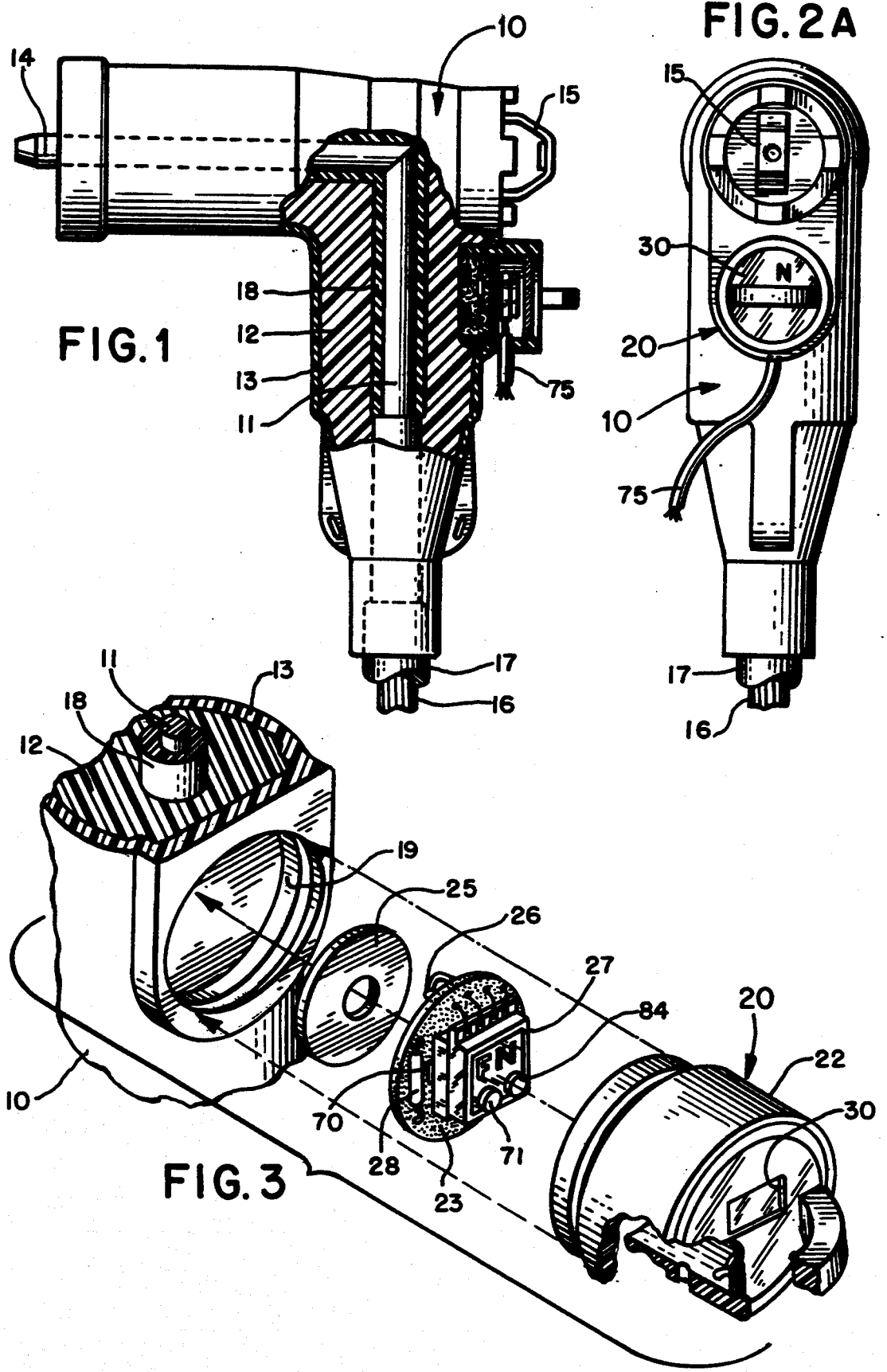

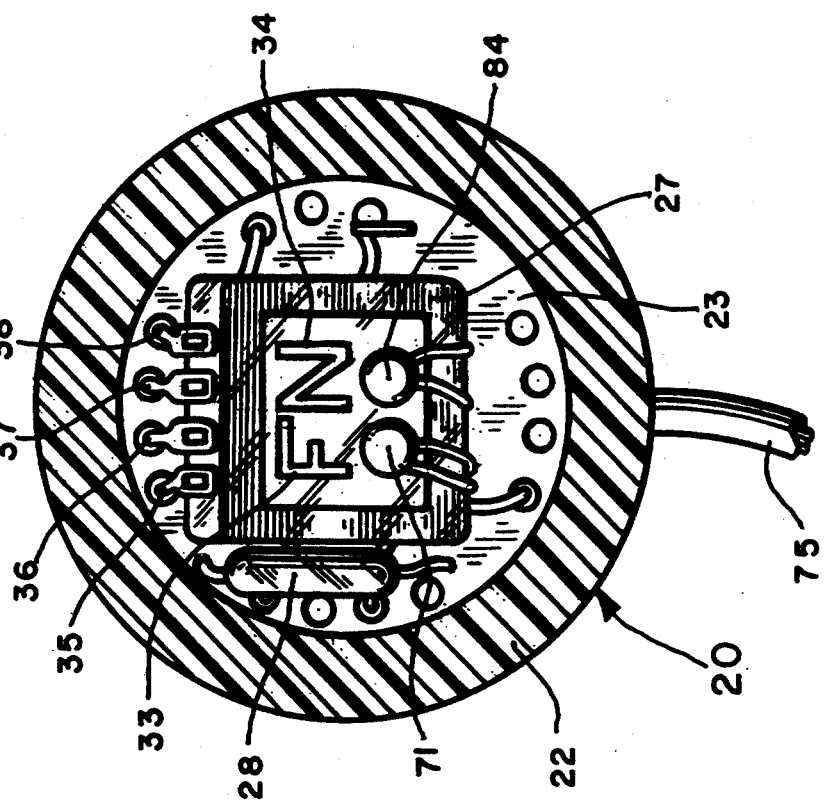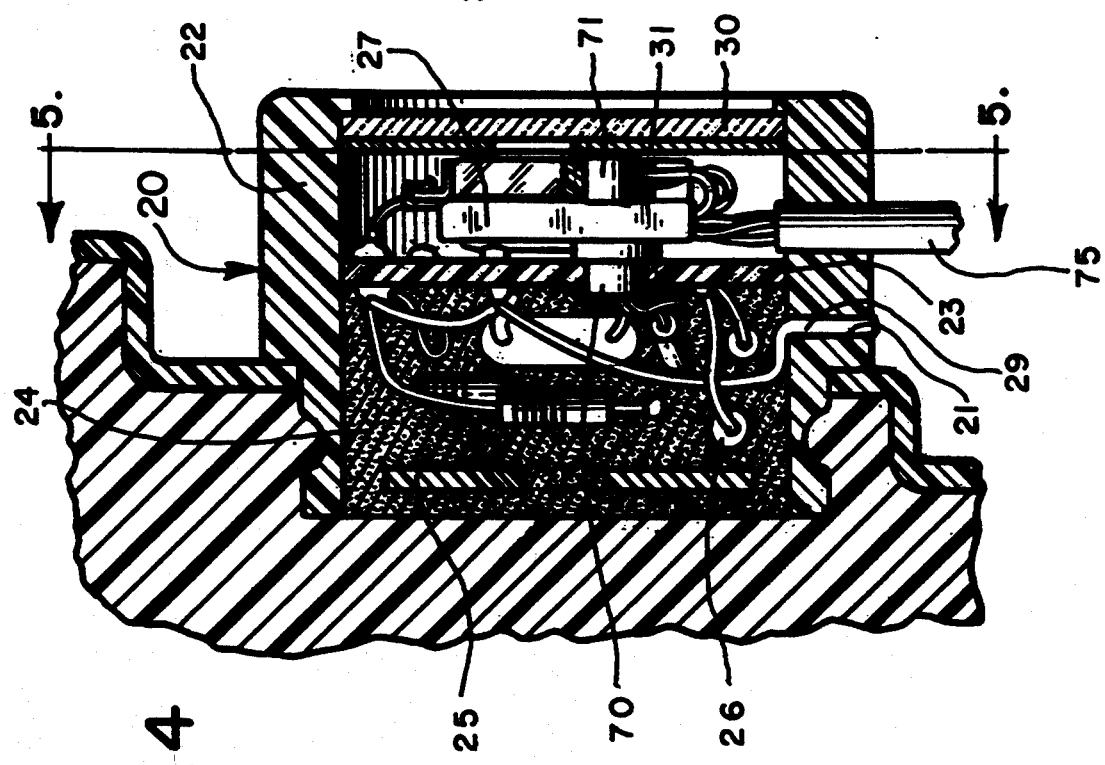

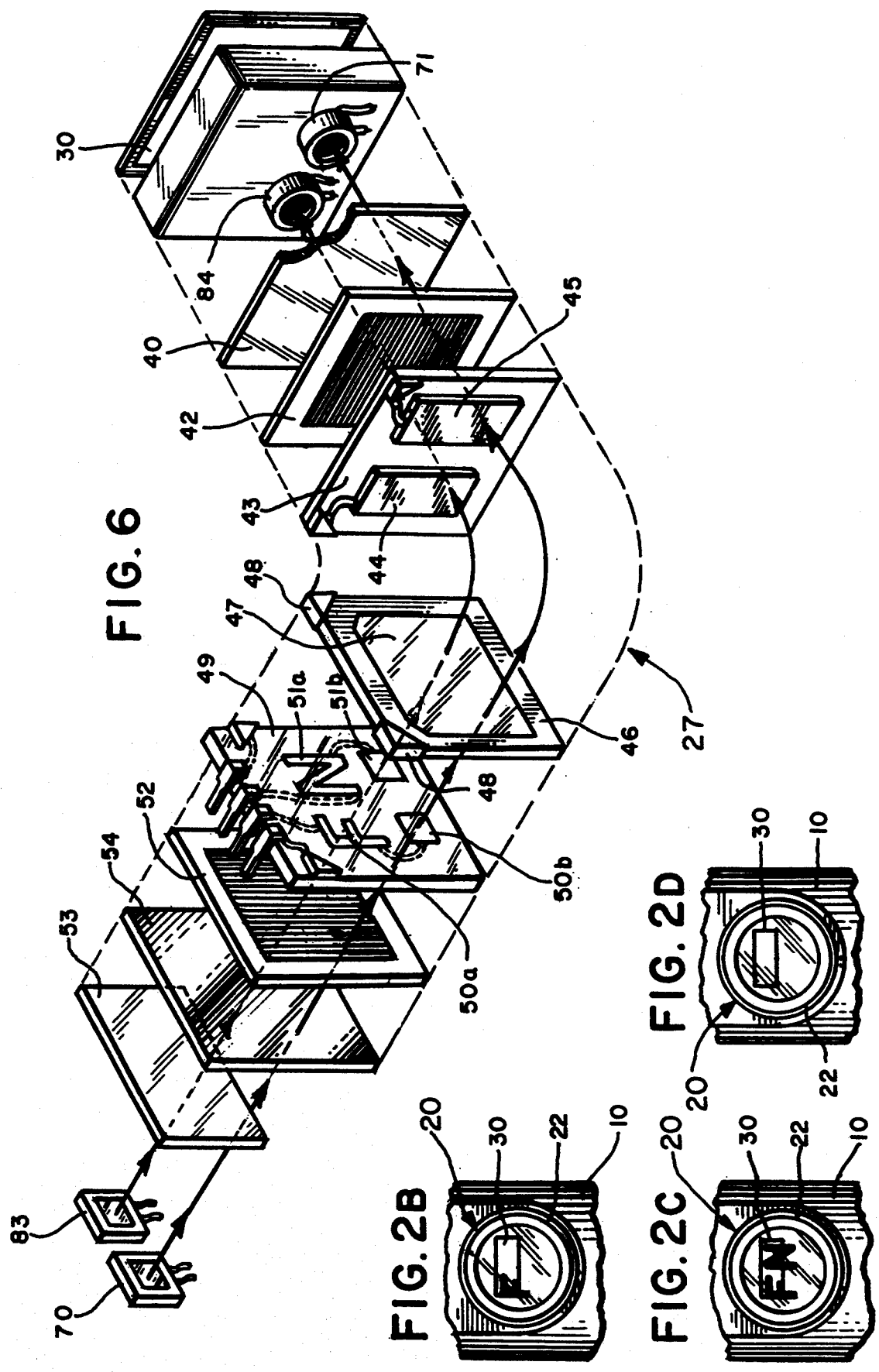

FAULT INDICATOR WITH OPTICALLY-ISOLATED REMOTE READOUT CIRCUIT

BACKGROUND OF THE INVENTION

The present invention is generally directed to circuit monitoring devices, and more particularly, to an improved remote-indicating fault indicator.

Various types of fault indicators have been constructed for detecting electrical faults in power distribution systems, including clamp-on type fault indicators, which clamp over a cable of the system and derive their operating power from the magnetic field surrounding the cable, and test-point mounted type fault indicator, which attach to test point sockets provided on connectors or other system components and derive their operating power by means of a capacitive coupling to the monitored conductor. In addition, either type of fault indicator may be either self-resetting, wherein the fault indication is automatically reset following resumption of current flow in the conductor, or manually reset, wherein an operator must manually clear a fault indication.

A particularly advantageous construction is shown in U.S. Pat. No. 5,070,301 of the present inventor, wherein high impedance liquid crystal displays are utilized in conjunction with a novel capacitive charge transfer circuit to provide an "F" indication following a fault, and an "N" indication during the presence of a normal current.

It is sometimes desirable to provide an indication or signal of fault occurrence and/or power restoration at a location remote from the fault indicator, as where a large number of circuits are monitored at a central control center, or where switching is to be controlled or inhibited in accordance with circuit status.

The present invention enables a preferred liquid crystal display type fault indicator to supply these remote indications with a minimum number of additional components and without the use of electromechanical relays or switch devices.

Accordingly, it is a general object of the present invention to provide a new and improved remote-indicating fault indicator.

It is a more specific object of the invention to provide a remote-indicating fault indicator which is more compact and easier to manufacture.

It is a still more specific object of the invention to provide a solid-state fault indicator which provides both fault and line powered circuit status indications at a remote location.

A fault indicator for signaling at a remote location the occurrence of a fault current in a monitored electrical conductor includes a housing, a high impedance optical shutter device having a pair of control electrodes disposed in operative association with a layer of voltage-responsive light controlling material, the optical shutter having a first light transmissivity condition in the absence of an actuating signal applied to the control electrodes, and a second light transmissivity in the presence of an actuating signal applied to the control electrodes. First circuit means including a voltage source apply an actuating signal to the control electrodes following occurrence of a fault current in the monitored conductor to condition the optical shutter device to the second light transmissivity condition. A light source directs a beam of light through the optical shutter device. A light detector receives the beam of light after transmission through the optical shutter device and produces an output dependent on the amplitude of the incident light; and second circuit means responsive to the output of the light detector produce an output signal indicative of the occurrence of a fault.

BRIEF DESCRIPTION OF THE DRAWINGS

The features of the present invention which are believed to be novel are set forth with particularity in the appended claims. The invention, together with the further objects and advantages thereof, may best be understood by reference to the following description taken in conjunction with the accompanying drawings, in the several figures of which like reference numerals identify like elements, and in which:

FIG. 1 is a side elevational view, partially in section, showing a remote-indicating fault indicator constructed in accordance with the invention installed in the test point of an elbow connector in a power distribution system.

FIG. 2A is a front elevational view of the fault indicator and connector of FIG. 1 showing a reset and powered indication of the fault indicator.

FIG. 2B is a partial front elevational view similar to FIG. 2A showing a fault and unpowered indication of the fault indicator.

FIG. 2C is a partial front elevational view similar to FIG. 2A showing a fault and powered indication of the fault indicator.

FIG. 2D is a partial front elevational view similar to FIG. 2A showing a reset and unpowered indication of the fault indicator.

FIG. 3 is an enlarged exploded perspective view of the fault indicator and certain principal components thereof shown relative to the test point socket.

FIG. 4 is an enlarged cross-sectional view of the fault indicator installed in the test point socket.

FIG. 5 is a cross-sectional view of the installed fault indicator taken along line 5—5 of FIG. 4.

FIG. 6 is an enlarged exploded perspective view showing the principal elements of the liquid crystal display and optical shutter component utilized in the fault indicator of FIGS. 1–5.

DESCRIPTION OF THE PREFERRED EMBODIMENT

Figure 7:
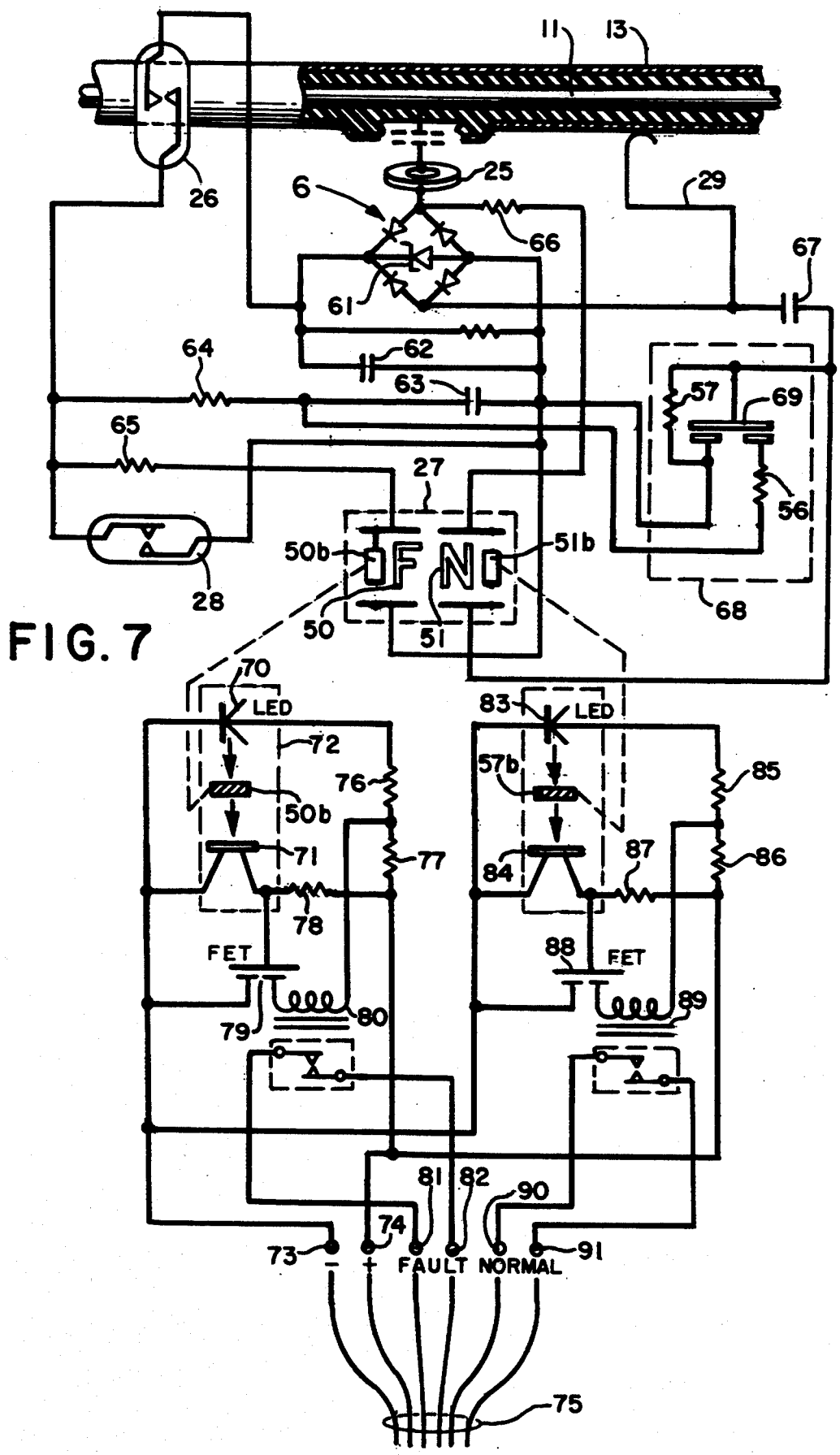
FIG. 7 is an electrical schematic diagram of the remote-indicating fault indicator of FIGS. 1–5.
Figure 8:
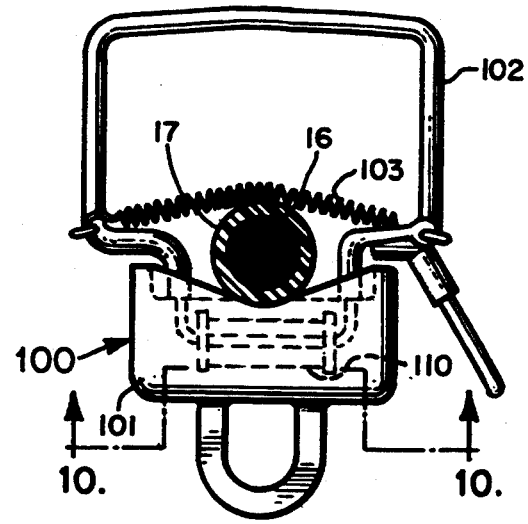
FIG. 8 is a perspective view of a clamp-on current powered type remote-indicating fault indicator installed on a power distribution cable.
Figure 9:
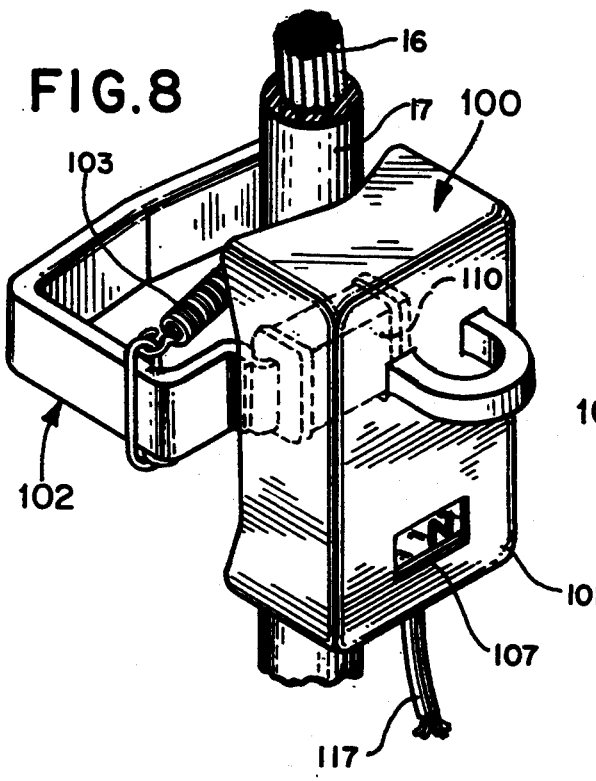
FIG. 9 is a top plan view of the fault indicator of FIG. 8 showing the engagement between the fault indicator and the cable.
Figure 11:
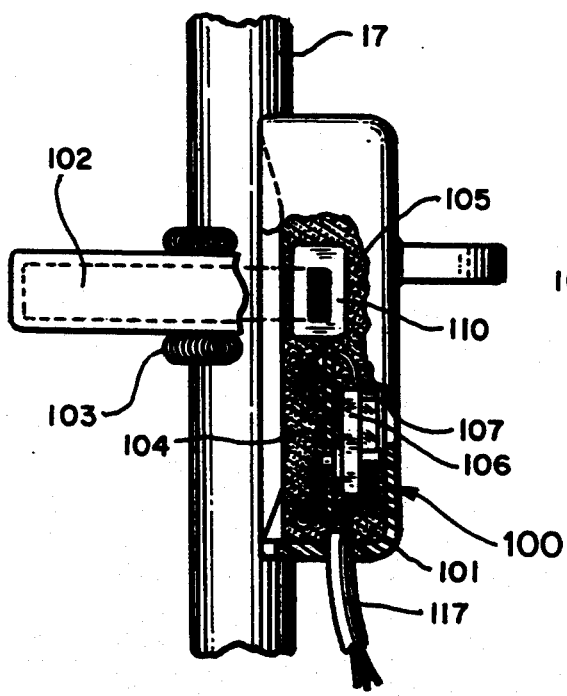
FIG. 11 is a cross-sectional view of the fault indicator of FIGS. 8–10 taken along line 11—11 of FIG. 10.
Figure 10:
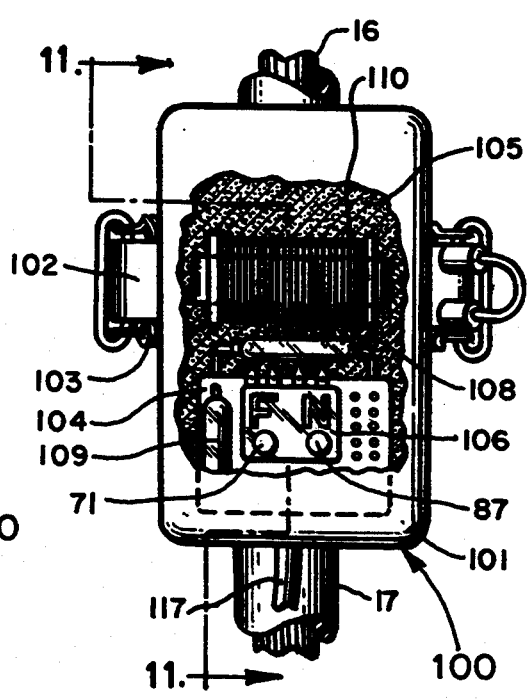
FIG. 10 is a cross-sectional view of the fault indicator of FIGS. 8 and 9 taken along line 10—10 of FIG. 9.

Referring to the drawings, and particularly to FIGS. 1–4, a plug-in type elbow connector for use in high voltage alternating current power distribution systems for establishing a plug-in connection to a transformer or other system component (not shown) is identified generally by reference numeral 10. As shown, the connector 10 includes generally a conductor 11 extending generally axially through an electrically non-conductive body portion 12 encased in an electrically-conductive sheath 13, the sheath being grounded in accordance with conventional practice. An electrically-conductive contact member 14 extends from conductor 11 to mate with a complementary contact on the associated system component. An arcuate member 15 having ends anchored in the conductive sheath 13 extends from the connector to receive the hooked end of a lineman's tool. The axial conductor 11 is connected, in accordance with conventional practice, to the conductor 16 of a flexible cable 17 of the type commonly utilized in power distribution systems. A layer 18 of semiconductive material may be provided around conductor 11 to provide stress relief for the electric field within the connector in a manner well known to the art.

To provide for detecting fault currents or voltage presence in conductor 11 connector 10 includes a test point socket 19 (FIG. 3) for receiving a fault indicator module 20. The test point socket 19, which is preferably constructed as described in U.S. Pat. No. 4,904,932 of the present inventor, is formed within the insulating body portion of the connector, extending through the electrically-conductive outer sheath 13. In particular, this socket preferably cylindrical in form and of an axial extent such that the test point socket 19 receives a substantial portion of the fault indicator housing.

The fault indicator module 20 is seen in FIGS. 3-5 to include a generally cylindrical housing 22 formed of an electrically conductive rubber or similar semi-resilient material within which the electrical components of the fault indicator are contained. In particular, within housing 22 the fault indicator module includes a disc-shaped insulator board 23 positioned perpendicularly to the axis of the housing at a location intermediate the ends thereof, and a layer 24 (FIG. 4) of high electrical resistance potting compound at the inside end of the housing for securing the insulator board in place. Additional electrical components included in housing 22 include, in accordance with the invention, a capacitive coupling element in the form of a metallic plate 25 for capacitively coupling the circuitry of the fault indicator to conductor 11, a first reed switch 26 aligned tangentially to the monitored conductor for sensing the occurrence of a fault current in the conductor, a high impedance optical display and shutter component 27 for visually indicating the occurrence of a fault current, and an optional second reed switch 28 (FIG. 3) aligned parallel to the monitored conductor for manually resetting a fault condition.

Operating power for the circuitry of fault indicator module 20 is derived from conductor 11 by means of the metallic plate 25, which when module 20 is seated in test point socket 19 is sufficiently closely spaced to the conductor to provide a level of capacitive coupling whereby an adequate alternating voltage is derived from the conductor. A necessary ground return for this circuitry may be provided, as shown in FIGS. 1-5, by an electrical conductor 29 which extends through an aperture 21 in the sidewall of housing 22. When housing 22 is seated in test point socket 19 conductor 29 is brought into electrical communication with the electrically grounded sheath 13 of the connector.

As shown in FIGS. 3 and 4, within housing 22 the liquid crystal display and shutter component 27 is positioned against a transparent window 30 such that the indicator face of the component is readily viewable from the exterior of the housing. A mask 31 formed of a thin sheet of opaque material may be provided on the inside surface of window 30 so that only the indicator face can be seen.

As shown in FIG. 5, the liquid crystal optical display and shutter component 27 is capable of independently producing an "F" display 33 to indicate a fault current, and an "N" display 34 to indicate the presence of voltage on conductor 11. Electrical connections are made with the component by means of four actuator terminals 35–38 arranged along the top edge of the component.

Internally, as shown in FIG. 6, the liquid crystal display component 27 generally includes a transparent face plate 40, a front polarizer 42, a glass plate 43 on which a pair of transparent backplane electrodes 44 and 45 are provided, a perimeter seal 46 containing a layer 47 of twisted nematic liquid crystal material, electrically conductive edge contacts 48, a glass plate 49 on which transparent indicator electrodes 50a and 51a and of optical shutter electrodes 50b and 51b are contained, a rear polarizer 52 aligned at right angles to front polarizer 42, a reflector 53 and a rear supporting plate 54.

Display and shutter component 27 is conventional in construction and operation. The "F" and "N" displays and optical shutter functions are controlled by the nematic liquid crystal layer 47, which in the absence of an applied electric field has the property of rotating the polarization of light as it passes through the molecular layers of the layer. In particular, as unpolarized light enters the display component through face plate 40, only vertically polarized light passes through front polarizer 42. The absence of an applied electric field, the polarization of this polarized light is rotated 90° as it passes through the nematic liquid crystal layer 47 and reaches rear polarizer 50. Since the polarization of the light has been rotated the light is able to pass through this polarizer onto the reflective layer 51, wherein it is reflected back through polarizer 50, rotated 90° by liquid crystal layer 47 and passed through polarizer 42 to front plate 40 and window 30. Thus, in the absence of an applied electric field light entering face plate 40 is passed through the device and reflected back out, presenting a blank or white colored appearance to the observer.

When electric fields are applied between electrodes 50 and 51 and their associated backplane electrodes 44 and 45 the intervening portions of the liquid crystal layer are caused to rotate the incident plate polarized light beyond 90°, thereby selectively decreasing the transmission and reflection of light to viewing window 30 in the "F" or "N" patterns to cause these characters to be displayed to a viewer as darkened letters, and thereby selectively decreasing the transmission of light through the associated optical shutters.

An electric field is established to generate the "F" display by applying a signal to actuator contacts 35 and 36, which connect to respective ones of display electrodes 45 and 50, and through connections 37 and 38, which connect to display electrodes 51 and 44, respectively. Consequently, by applying a signal between contacts 35 and 36 the "F" display 33 is caused to appear at face plate 40, and by applying a signal between terminals 37 and 38 the "N" display 34 is caused to appear. At the same time, portions of the nematic layer between the optical shutter electrodes 50b and 51b and the corresponding back plate electrodes provide an elliptical polarization to passing light such that the transmissivity of component 27 through this region decreases with increasing voltage on control terminals signaling the fault occurrence of a remote location in a manner to be described.

Referring to FIG. 7, the necessary signals for actuating the "F" and "N" optical displays 50a and 51a and optical shutters 50b and 51b are provided by a line-powered circuit within housing 22. In particular, the circuit includes a full-wave bridge rectifier 60 having one input terminal connected to the capacitive coupling plate 25 and its other input terminal connected to ground through ground lead 29. Thus connected the bridge rectifier network is capacitively coupled to the monitored conductor 11 and produces as a result of AC voltage on that conductor a direct current at its output terminals. The output terminals are connected to charge storage means in the form of a capacitor 62 which develops a charge at a voltage level dependent on a zener diode 61 connected across the capacitor.

Upon occurrence of a fault current, capacitor 62 is momentarily connected by a fault current-actuated reed switch 26 to additional charge storage means in the form of a display capacitor 63 such that a portion of the charge on capacitor 62 is transferred to capacitor 63. A series-connected resistor 64 serves to reduce the rate at which the charge is transferred to prevent damage to the switch contacts from excessive current flow. The voltage developed across display capacitor 63 as a result of the transferred charge serves as a voltage source, providing a voltage signal which is applied to the "F" optical display and shutter control electrodes of component 27 through a resistor 65 such that the display component 50a displays an "F" character to the user and optical shutter 50b is closed. This display continues until the charge on capacitor 63 depletes with time to a voltage level insufficient to maintain the alignment of the molecules in the nematic liquid crystal layer. In practice, capacitor 63 will have sufficient charge to maintain the fault indicator and optical shutter for up to 36 hours, this time being primarily dependent on the net charge transferred to the capacitor and the internal leakage of the capacitor. A lesser duration may be provided if desired by increasing the current drain from the capacitor.

Fault indicator 20 may also include an "N" segment display and optical shutter to indicate the presence of operating voltage on monitored conductor 11. In particular, this is accomplished by connecting the "N" display electrodes 45 and 51 of display component 27 to the capacitive coupling plate 25 through a resistor 66 and coupling capacitor 67. In the presence of alternating current on the monitored conductor the "N" display 34 appears and the user is informed that the conductor is powered. At the same time, optical shutter 51b is closed, signaling voltage presence at a remote location in a manner to be described.

It will be noted that the "F" display 33 and its associated optical shutter are controlled by direct current supplied by capacitor 63, whereas the "N" display 34 and its associated optical shutter are powered by alternating current derived through resistor 66 and capacitor 67. Thus, the two displays are independent of each other.

Furthermore, it will be noted that the reflecting panel 53 of component 27 is dimensioned to reflect only light associated with the "F" and "N" display portions, and not light associated with the optical shutter portions. As will be described, this allows the shutter portions to control light passing through the component.

Once the fault indication has occurred, should it be desired to cancel the "F" indication, as for example when re-powering the affected circuit after a transient fault, it is only necessary to discharge capacitor 63 by actuating the optionally provided manual reset reed switch 28 by momentarily applying a magnetic field at the exterior of the housing. To this end, the reed switch is preferably located at an accessible location near the front face plate of the housing, with its axis aligned generally parallel to the axis of conductor 11 so that the switch will not be actuated by fault currents in the conductor.

In many applications it is desirable that following a fault occurrence a fault indicator be self-resetting, i.e., automatically return to a reset state upon restoration of voltage to the monitored conductor. As shown in FIG. 7, this may be accomplished by providing an optional reset circuit 68 which includes a field effect transistor (FET) 69 having principal source and drain electrodes connected through a resistor 56 to capacitor 63, and a high impedance gate electrode coupled to the monitored AC conductor through the "N" display and shutter circuit.

Upon restoration of voltage in the conductor, FET 69 is caused to conduct and discharge capacitor 63. The fixed series resistance reduces the rate discharge through the principal electrodes of FET 69 to preclude capacitor 63 from being discharged during a fault, prior to interruption of voltage on the monitored conductor, as well as preventing the discharge current from exceeding the limits of the FET. An additional resistor 57 connected between the drain and gate electrodes biases the device to a cut-off state in the absence of a signal on the date electrode.

In accordance with the invention, the occurrence of a fault is signaled at a location remote from housing 22 by means of a signaling circuit including a light emitting diode (LED) 70 within housing 22, which projects a light beam through the optical shutter portion 50b of component 27. After passing through the optical shutter the beam is received by a Darlington phototransistor 71, which provides an impedance change with changes in the amplitude of incident light. The LCD optical shutter 50b, LED 70 and phototransistor 71 may be arranged in a compact assembly 72 which provides electrical isolation between the sensing circuits associated with the LCD device and the monitored AC source, and the control circuitry associated with phototransistor 71.

Power is supplied to the signaling circuit through contacts 73 and 74, which may be contained in housing 22 and connected through individual conductors in a multi-conductor cable 75 to a remote DC source. LED 70 is powered from this source through a pair of resistors 76 and 77, and phototransistor 71 is connected to the source through a resistor 78. A threshold level for actuation of the alarm circuit is established by a field effect transistor 79, which energizes a relay 80 from the DC source.

Upon the occurrence of a fault current the light incident on photo transistor 48 increases, causing the impedance of the transistor to decrease, and the voltage applied to the gate electrode of FET 79 to increase. This causes the FET to conduct and actuate relay 80. The relay contacts in turn provide a signal at terminals 81 and 82 for actuation, through individual conductors in cable 75, of a remote alarm or other switching function.

With actuation of relay 80 the voltage drop across resistor 77 increases, causing LED 70 to produce less light. This in turn causes the impedance of photo transistor 79 to increase and thus provide a latching function with helps to maintain relay 80 energized.

Relay 80 continues to be energized until the "F" indication is reset, at which time the light incident on photodetector 71 increases and the impedance of the photodetector decreases to a level where FET 79 is no longer conductive. At this time relay 80 is de-energized, the relay contacts open and the control effect is no longer present on terminals 81 and 82.

The occurrence of an "N" display can be similarly signaled to the remote location. In particular, a second LED 83 is arranged to project a light beam through the "N" optical shutter to a phototransistor 84, which together with resistors 85, 86 and 87 operates in the manner of phototransistor 71 to control an FET 85 and relay 89 to provide a control signal at contacts 90 and 91 associated with cable 75.

The invention may also be utilized in a current-powered application. Referring to FIGS. 8–11, a current-actuated remote-indicating fault indicator 100 constructed in accordance with the invention may include a generally rectangular housing 101 secured to a monitored cable 17 by means of a resilient magnetic pole assembly 102 which encircles the cable. The magnetic pole assembly is held in a closed position by a spring 103 which secures cable 17 against a V-shaped recess in the housing.

Within housing 101 fault indicator 100 includes a circuit board 104 (FIGS. 10 and 11) on which the principal components of the indicator are mounted. A layer of potting compound 105 seals the circuit board within the housing. Circuit status is indicated locally at the fault indicator by a high impedance liquid crystal optical display and shutter component 106, which is mounted on the circuit board and may be identical in construction and operation to the component 27 previously described. Component 106 is positioned behind a viewing window 107 such that the "F" and "N" displays of the component can be readily observed from the exterior of the housing. A first reed switch 108 (FIG. 10) aligned generally tangentially to the monitored conductor senses the occurrence of fault currents in the conductor. An optional second reed switch 109 aligned generally parallel to the axis of the monitored conductor allows the user to reset a fault indication by means of an external magnet.

Figure 12:
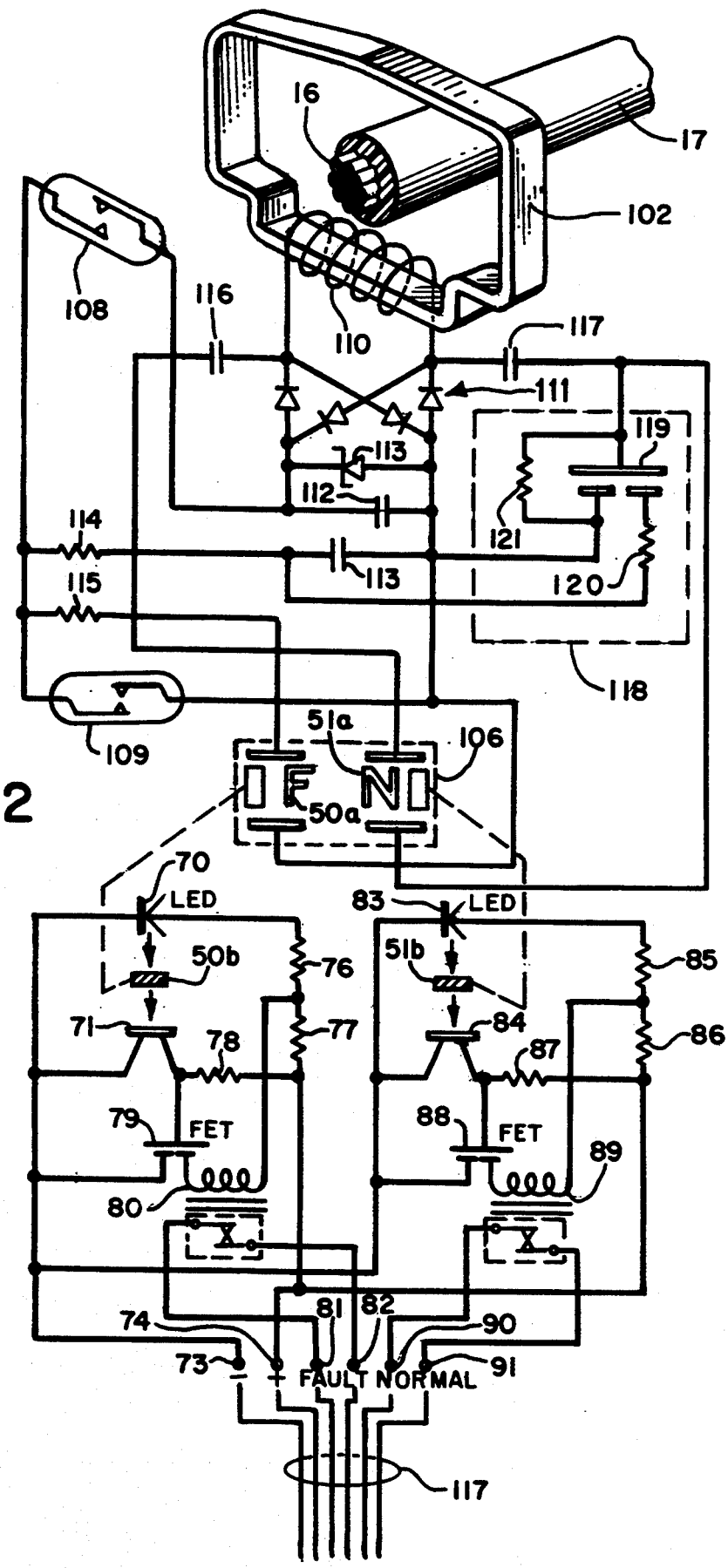
FIG. 12 is an electrical schematic diagram of the remote-indicating fault indicator of FIGS. 8–11.

Operating power for the circuitry of fault indicator 100 is obtained by means of a winding 100 disposed on magnetic core 102 within housing 71. In the presence of alternating current in the monitored conductor 16 a current is induced in winding 110. As shown in FIG. 12, the induced alternating current is supplied to the input terminals of a bridge rectifier network 111, wherein it is rectified to develop a charge within a capacitor 112. A zener diode 113 connected across this capacitor limits the voltage developed across the capacitor.

Upon occurrence of a fault current in the monitored conductor, reed switch 108 momentarily closes and a portion of the charge developed in capacitor 112 is conveyed through the switch to a second capacitor 113. Capacitor 113 is connected to the "F" optical and shutter electrodes of optical display and shutter component 106 such that the display portion 50a of the component is caused to display the character "F" to the user and the optical shutter portion 50b of the component is rendered opaque to signal that a fault has occurred. A resistor 114 is connected in series with capacitor 113 to limit current flow through the switch contacts, and a resistor 115 is connected in series with the "F" display electrodes. In practice, the "F" display may last 36 hours or more, depending primarily on the charge transferred to capacitor 113 and the internal leakage current of the capacitor. Capacitor 113 may be discharged by the user at any time by actuation of the optional reed switch 109 by means of an external magnet.

The "N" display of display component 106 may be actuated by the current induced in winding 110 when the monitored conductor 16 is powered. A pair of capacitors 116 and 117 connect the "N" display electrodes to winding 110 to this end.

Thus, in the manner of the previously described capacitively-coupled fault indicator of FIGS. 1–7, upon occurrence of a fault an "F" indication is provided which indicates to the user that a fault has occurred. This indication remains until the reset switch 109 has been actuated by the user, or until capacitor 113 discharges to a voltage level below that sufficient to maintain the indication on display component 106. An "N" indication appears whenever the monitored conductor is energized.

At the same time, the corresponding optical shutters 50b and 51b, in conjunction with an LED light source, and signaling circuitry including a photodetector responsive to light transmission through the optical shutter, signal the fault and powered states to a remote location through a cable 117.

Automatic resetting of fault indicator 100 may be achieved by means of an optional reset circuit 118 similar to the previously described reset circuit 68. In particular, the reset circuit may include an enhanced FET 119 having principal source and drain electrodes connected to capacitor 113 through a current limiting resistor 120, and the high impedance gate electrode may be coupled to winding 110 through the "N" display capacitor 117, or through an additional capacitor, and biased to cut-off by a resistor 121. Upon restoration of current in conductor 16, FET 119 is rendered conductive and capacitor 113 is discharged to terminate the "F" indication.

While the use of other types of high impedance voltage-actuated light controlling devices such as Kerr cells, wherein a dielectric under electrostatic stress becomes doubly refracting so as to convert plane-polarized light to elliptical polarization, is possible, liquid crystal display (LCD) components, because of their extremely high input impedance, are particularly well adapted to the invention. The high input impedance of these devices, typically in excess of $10 \times 10^{--}$ohms, results in a very low current drain from the display capacitor. This allows the capacitor to retain sufficient charge for operating the display over an extended period, typically in excess of 36 hours, limited primarily by the internal leakage current of the capacitor. In practice, this is more than sufficient time for a repair crew to locate and repair a fault, even in a large distribution system.

Furthermore, depending on the particular liquid crystal material used, LCD components exhibit a well defined threshold voltage, over a wide range of ambient temperatures below which the display does not respond to an applied signal. In one successful embodiment of the invention using a Type 7 twisted nematic field effect LCD manufactured by Standish Industries, Inc. of Lake Mills, Wis., U.S.A., this threshold is 2.0 volts, which is sufficiently high to prevent the display from falsely responding to residual voltages, but not so high as to require an undesirably large charge on the display capacitor.

While the illustrated embodiments provide a visual display as well a remote signaling output, it may be desirable in some applications to omit the visual indications and provide only the optical shutters and their associated signaling circuitry for indications at a remote location.

While particular embodiments of the invention have been shown and described, it will be obvious to those skilled in the art that changes and modifications may be made therein without departing from the invention in its broader aspects, and, therefore, the aim in the appended claims is to cover all such changes and modifications as fall within the true spirit and scope of the invention.

I claim:

1. A fault indicator for signaling at local and remote locations the occurrence of a fault current in a monitored electrical conductor, comprising:
   a housing;
   status indicating means within said housing comprising a high impedance optical shutter device having a pair of control electrodes disposed in operative association with a layer of voltage-responsive light controlling material, the optical shutter having a first display status and light transmissivity condition in the absence of an actuating signal applied to said control electrodes, and a second display status and light transmissivity in the presence of an actuating signal applied to said control electrodes, said display status of said optical shutter and display device being locally viewable from the exterior of said housing;
   first circuit means including a voltage source for applying an actuating signal to said control electrodes following occurrence of a fault current in the monitored conductor to condition said optical shutter device to said second light transmissivity condition;
   a light source adapted to direct a beam of light through said optical shutter device;
   a light detector adapted to receive said beam of light after transmission through said optical shutter device and to produce an output dependent on the amplitude of the incident light; and
   second circuit means responsive to the output of said light detector for producing an output signal for indicating at a remote location the occurrence of a fault.

2. A remote-signaling fault indicator as defined in claim 1 wherein said optical shutter device comprises a liquid crystal display device.

3. A remote-signaling fault indicator as defined in claim 1 wherein said light detector comprises a photodetector.

4. A remote-signaling fault indicator as defined in claim 1 wherein said second circuit means include a Field Effect Transistor.

5. A remote-signaling fault indicator as defined in claim 1 wherein said light source comprises a light emitting diode.

* * * * *